United States Patent [19]
Elliot et al.

[11] Patent Number: 5,838,877
[45] Date of Patent: Nov. 17, 1998

[54] NOISE SUPPRESSION IN PWM-DRIVEN DC MOTOR

[75] Inventors: James Elliot; Mohamed Abbas, both of Dayton; John R. Suriano, Kettering; Thomas W. Holmes, Tipp City, all of Ohio

[73] Assignee: ITT Automotive Electrical Systems, Inc., Auburn Hills, Mich.

[21] Appl. No.: 510,430

[22] Filed: Aug. 2, 1995

[51] Int. Cl.[6] .................................................. H02P 5/06
[52] U.S. Cl. ........................ 388/804; 318/434; 388/804
[58] Field of Search .................... 361/111, 91, 107, 361/108, 23–34; 318/434; 388/804

[56] References Cited

U.S. PATENT DOCUMENTS

| | | | |
|---|---|---|---|
| 2,698,910 | 1/1955 | Blyth | 310/51 |
| 2,827,582 | 3/1958 | Krebs | 310/168 |
| 3,866,093 | 2/1975 | Kusters et al. | 317/18 |
| 4,013,829 | 3/1977 | Baar et al. | 358/299 |
| 4,320,329 | 3/1982 | Gille et al. | 318/443 |
| 4,473,920 | 10/1984 | Itani | 15/250.22 |
| 4,527,105 | 7/1985 | Shiraishi | 318/444 |
| 4,544,870 | 10/1985 | Kearns et al. | 318/444 |
| 4,625,157 | 11/1986 | Phillimore | 318/443 |
| 4,634,944 | 1/1987 | Hastings et al. | 318/443 |
| 4,658,213 | 4/1987 | Finley | 324/158 |
| 4,663,575 | 5/1987 | Juzswik et al. | 318/444 |
| 4,672,253 | 6/1987 | Tajima et al. | 310/269 |
| 4,673,851 | 6/1987 | Disser | 318/341 |
| 4,687,977 | 8/1987 | Brahmavar et al. | 318/492 |
| 4,689,535 | 8/1987 | Tsumoda et al. | 318/443 |
| 4,692,645 | 9/1987 | Gotou | 310/184 |
| 4,761,576 | 8/1988 | Savage | 310/51 |
| 4,774,424 | 9/1988 | Habermann | 310/90.5 |
| 4,874,975 | 10/1989 | Hertrich | 310/186 |
| 4,890,024 | 12/1989 | Hashimoto et al. | 310/49 R |
| 4,933,584 | 6/1990 | Harms et al. | 310/162 |
| 4,947,066 | 8/1990 | Ghibu et al. | 310/49 R |
| 4,947,092 | 8/1990 | Nabha et al. | 318/444 |
| 5,030,899 | 7/1991 | Nishibe et al. | 318/444 |
| 5,086,245 | 2/1992 | Sieja et al. | 310/216 |
| 5,173,651 | 12/1992 | Buckley et al. | 318/701 |
| 5,306,992 | 4/1994 | Dröge | 318/483 |
| 5,331,257 | 7/1994 | Materne et al. | 318/85 |

*Primary Examiner*—William M. Shoop, Jr.
*Assistant Examiner*—Kim Lockett
*Attorney, Agent, or Firm*—J. Gordon Lewis; Thomas N. Twomey

[57] ABSTRACT

A system for reducing Radio Frequency Interference (RFI) produced by motors which are powered by Pulse Width Modulation (PWM). It is believed that the PWM induces radiation at the PWM frequency and harmonics. The invention shields power cables which carry the PWM pulsed current, and provides capacitive shunting of one of the cables to ground.

11 Claims, 10 Drawing Sheets

FIG-3

FIG-3A (FLOATING CASE)

FIG-10

NOISE SUPPRESSION IN PWM-DRIVEN DC MOTOR

The invention concerns suppression of radio frequency interference produced by a DC motor in which speed is controlled by Pulse Width Modulation (PWM).

BACKGROUND OF THE INVENTION

Figure 1:
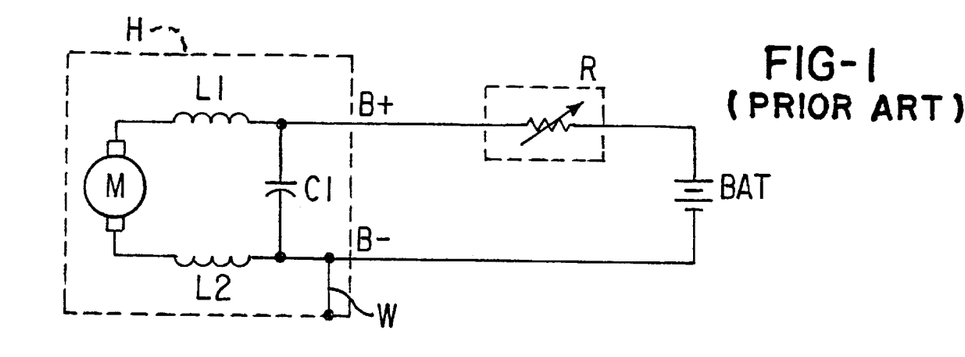
FIG. 1 illustrates a prior art motor, filter, and speed control.

FIG. 1 illustrates a motor M used in the prior art, such as to power a blower in an automotive air conditioner. A vehicle battery BAT powers the motor. The motor is contained within a conductive housing H. The motor contains brushes and a commutator (not separately shown) which cause electrical arcing and sparking, and produce high-frequency Radio Frequency Interference (RFI).

The RFI can interfere with communication devices, such as radios, tape players, televisions, ham radios, and cellular telephones. Measures taken to reduce the RFI include connecting the housing H to the negative terminal, B−, of the motor, as indicated by wire W, and installation of a filter which includes inductors L1, L2, and capacitor C1.

The motor shown uses a simple type of speed control, illustrated by the adjustable resistor R. Adjusting the resistor modifies the voltage presented to motor terminals B+ and B−, by the voltage divider principle. However, such speed controls, although simple, are inefficient, because power is dissipated in the resistor. Not only does this dissipation represent wasted power, but the wasted power is dissipated as heat, which poses a heat elimination problem.

To avoid these problems, the inventors have investigated Pulse Width Modulation (PWM) for controlling motor speed.

OBJECTS OF THE INVENTION

An object of the invention is to reduce radio frequency interference in pulse-width controlled motors.

SUMMARY OF THE INVENTION

In one form of the invention, a PWM controller is used to remotely control a motor. The system was found to produce RFI at the PWM's base frequency, and at harmonics, as well as at other frequencies. The invention includes a filter system for reducing the RFI.

DETAILED DESCRIPTION OF THE INVENTION

Figure 2:
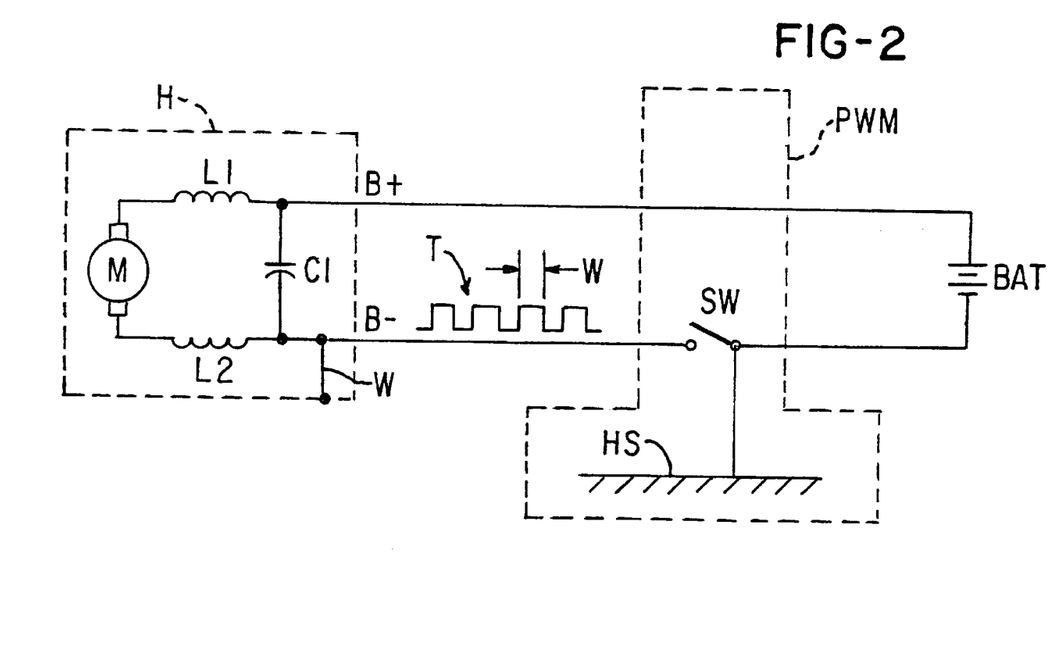
FIG. 2 illustrates a test wherein a different speed control was used for the motor of FIG. 1.

The inventors modified the apparatus of FIG. 1 by adding a Pulse Width Modulation Controller, labeled PWM, as shown in FIG. 2. The PWM includes a heat sink HS, which is electrically grounded. The PWM generates a train T of square wave pulses. The width W of the pulses is modulated, thereby modulating the energy delivered to the motor M, thereby controlling motor speed. The frequency of the pulses was 20 KiloHertz (KHz).

Figure 3:
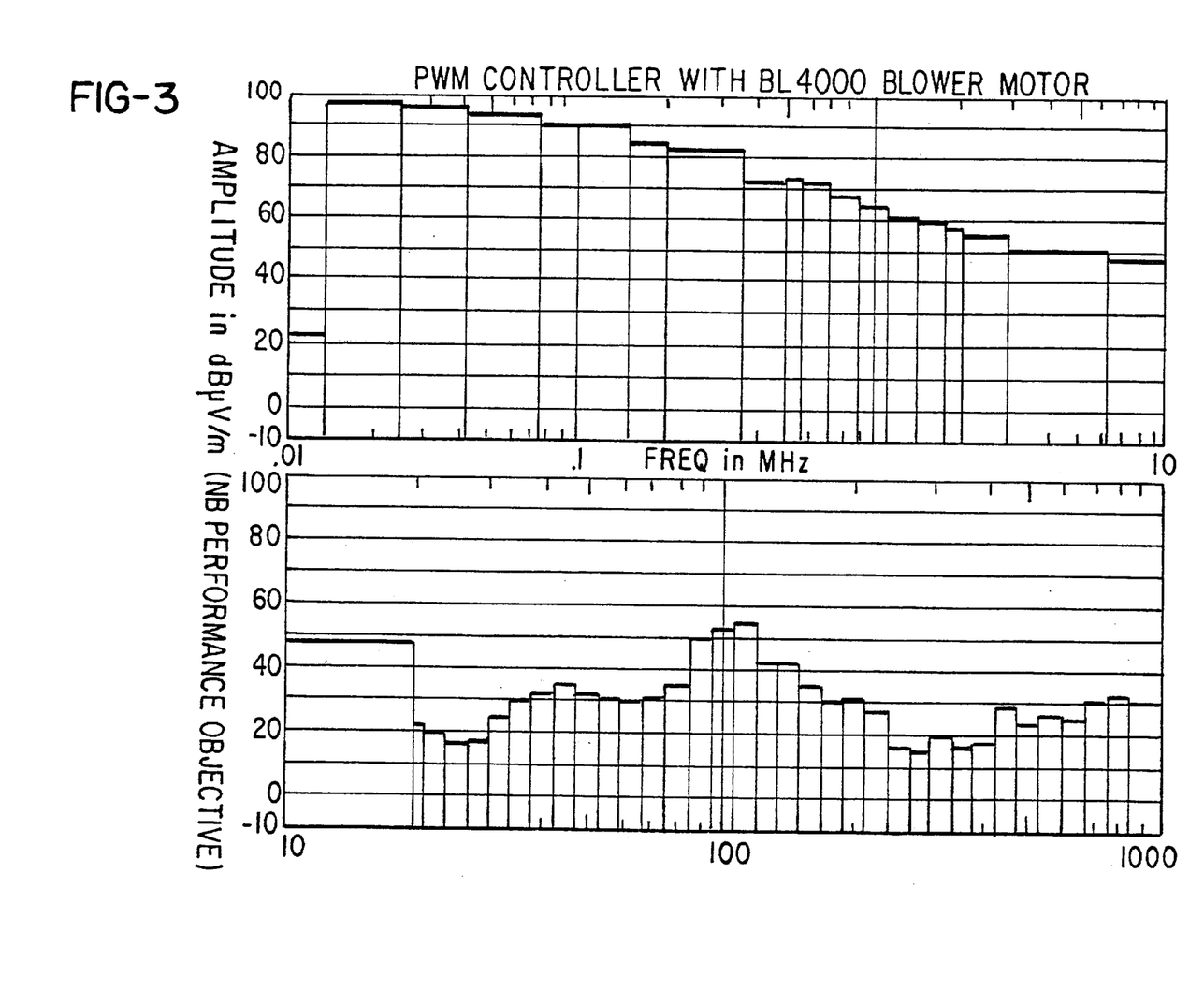
FIG. 3 is a plot showing results of a noise test of the apparatus of FIG. 2.

The inventors tested the PWM system for noise production. FIG. 3 shows results. One significant feature of FIG. 3 is that significant noise begins near 20 KHz, at point A in the Figure. Since this noise begins at approximately 20 KHz, which is the PWM base frequency, this noise is perhaps attributable to the PWM modulation, and its harmonics.

One possible explanation lies in the connection of the housing H to the negative motor terminal B−, as shown in FIG. 2. When the switch SW closes, the housing is pulled to ground. When the switch SW opens, the housing is pulled to the battery potential. Thus, the housing alternately jumps between ground and battery potential at a frequency of 20 KHz, and can act as a radiator.

The inventors found that merely disconnecting the housing from the negative motor terminal B− did not remove the noise. A test of the system shown in FIG. 2, but with (a) the connection between B− and the housing H eliminated (that is, with the housing left floating), and (b) chokes L1 and L2 eliminated, produced the results shown in FIG. 3A.

Figure 3A:
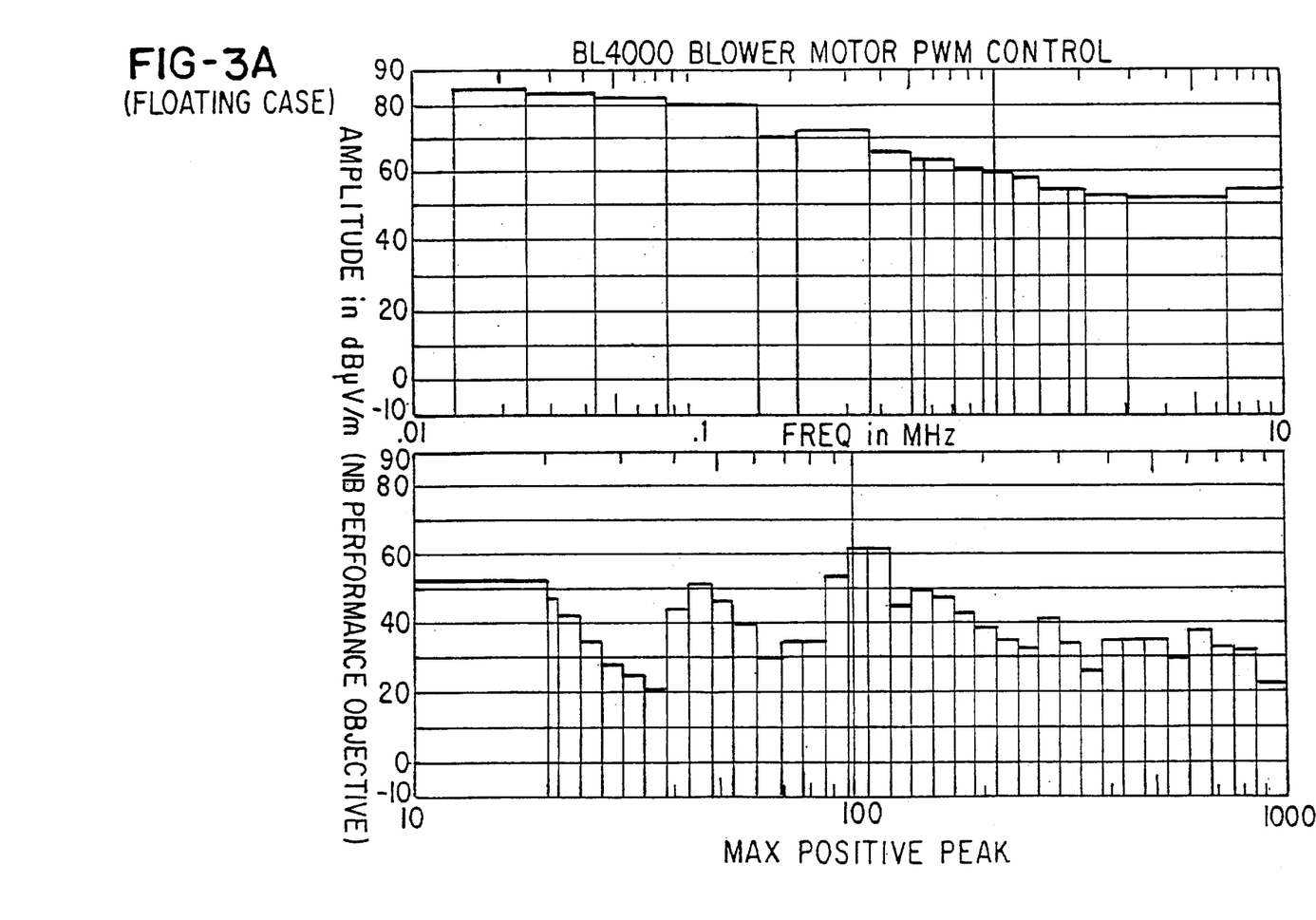
FIG. 3A is a plot showing results of a noise test of apparatus similar to that of FIG. 2, but in which the housing H is left floating, and in which chokes L1 and L2 have been removed.

The results in FIGS. 3 and 3A, at low frequencies (i.e., below about 10 MHz), are somewhat similar, indicating that grounding the housing H in FIG. 2 may not reduce noise. (The elimination of the chokes L1 and L2 for FIG. 3A is not a significant factor at the low frequencies. These chokes are designed to block high-frequency noise, in the range of 10 MHz to 100 MHz, and above. Consistent with this, as FIG. 3A indicates, the elimination of the chokes does increase noise at these high frequencies.)

One Form of the Invention

Figure 4:
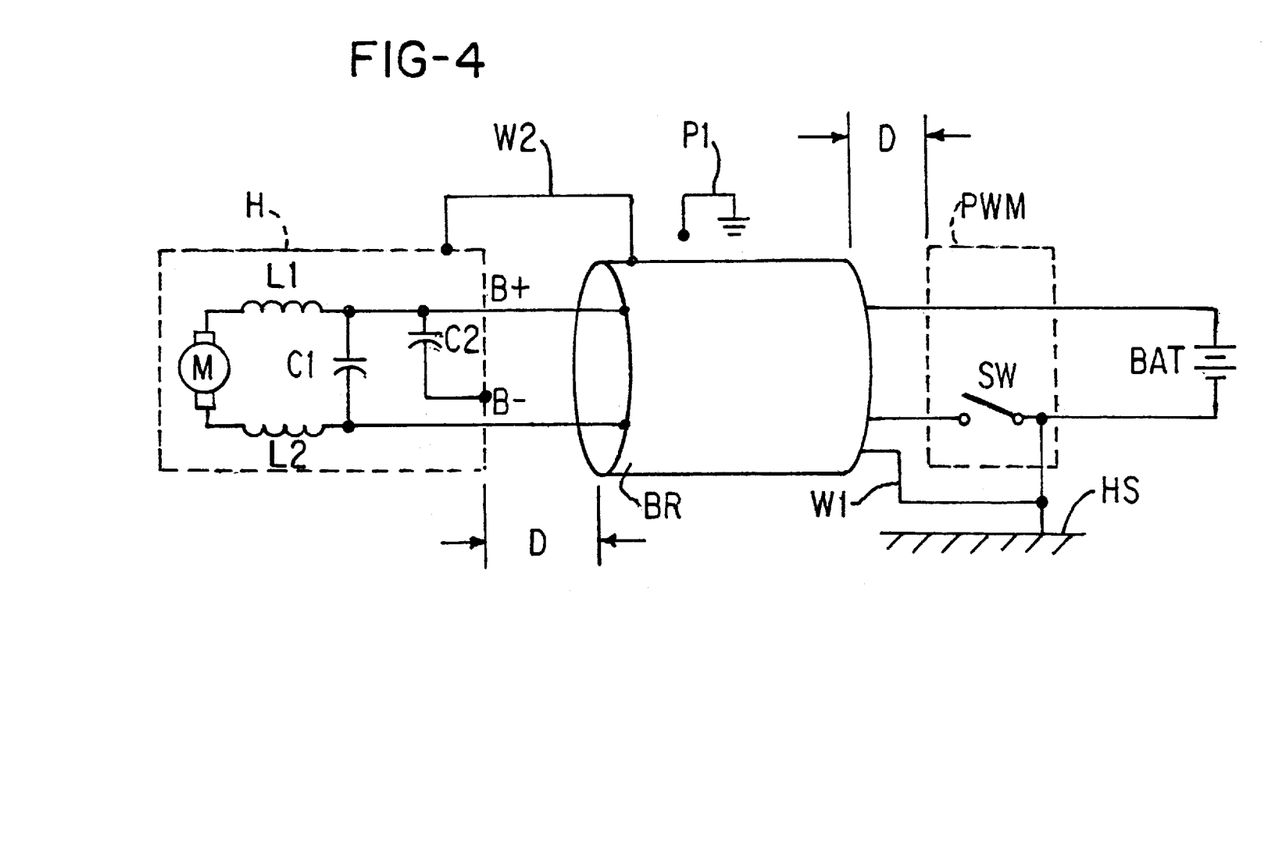
FIG. 4 illustrates one form of the invention.

FIG. 4 illustrates one form of the invention. A hollow, braided shield BR surrounds the conductors feeding B+ and B−. The shield is about 12 inches long. This shield need not completely cover the exposed conductors, but about two or three inches of conductor, at each end, are left exposed, as indicated by dimensions D.

Since the RFI wavelengths intended to be suppressed are very long, compared to the exposed conductors, the exposed conductors act as poor radiators. (In general, for good radiation, the radiator, or antenna, must be a significant fraction of a wavelength.)

The braided shield BR is grounded, as indicated by wire W1, which connects to the ground of the heat sink HS. The braided shield is also connected to the housing H, as indicated by wire W2.

Figure 5:
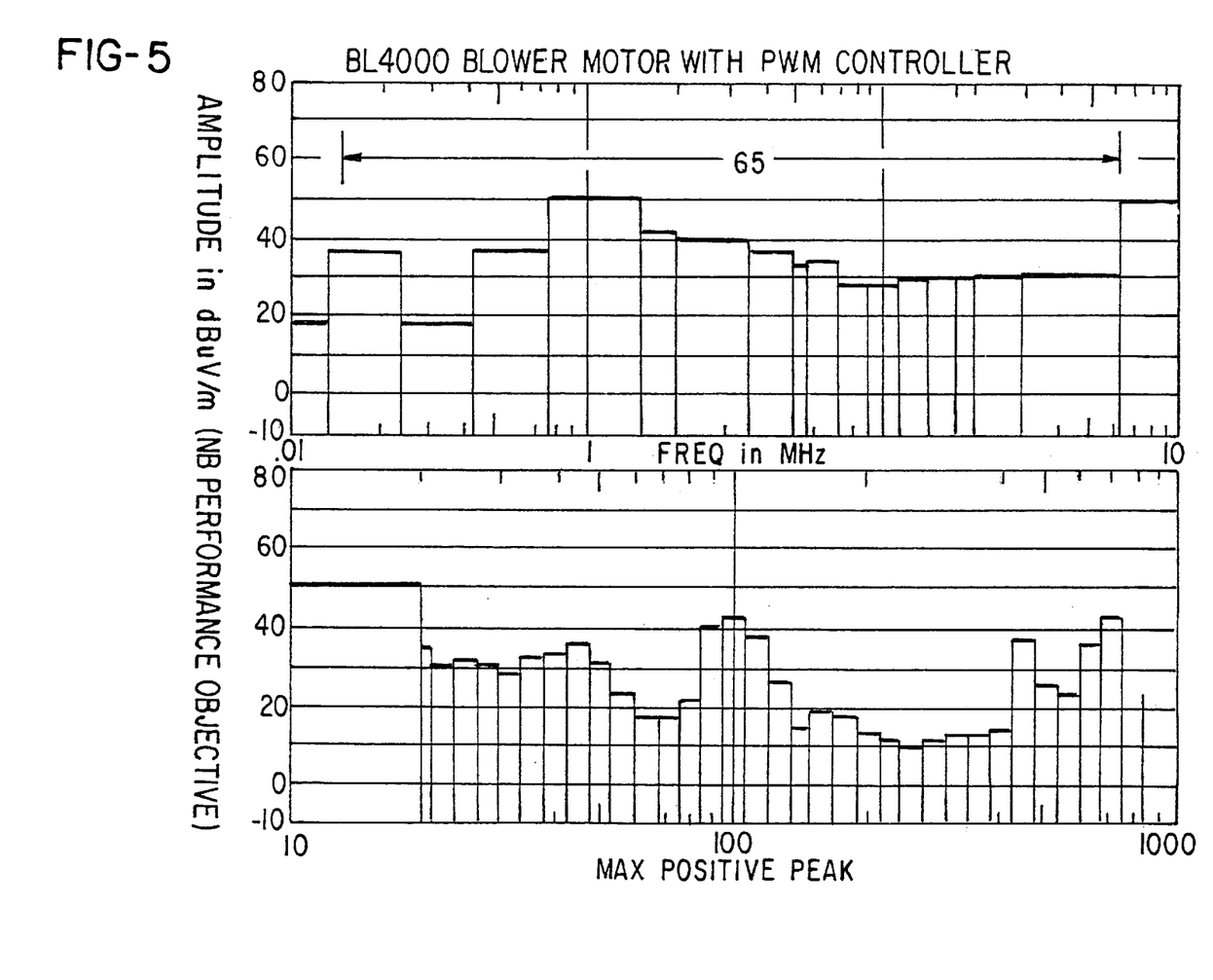
FIG. 5 is a plot showing results of the test of the apparatus of FIG. 4.

The positive power lead, B+, is coupled to the housing H, and thence to ground through the braided shield BR, through a capacitor C2. Preferred values of the components shown in FIG. 5 are given in the following TABLE 1.

TABLE 1

| Component | Preferred Value |
|---|---|
| L1 | 4.0 micro-Henry |
| L2 | 4.0 micro-Henry |
| C1 | 0.001 micro-Farad |
| C2 | 500 pico-Farad |

The housing H is not connected to the negative motor terminal B−, contrary to the situation shown in FIG. 2.

Test Results

The system of FIG. 4 was tested for RFI noise production. The test was similar to that which produced the plot of FIG. 3, and results are shown in FIG. 5. In the frequency range spanning from about 15 KHz to about 6 MHz, indicated by range 6, significant reduction in measured noise power was found. Some examples are given in the following TABLE 2.

TABLE 2

| Frequency | Noise (FIG. 3) (dB Units) | Noise (FIG. 5) (dB Units) | Reduction (dB Units) |
|---|---|---|---|
| 20 KHz | 97 | 38 | 59 |
| 30 KHz | 96 | 18 | 78 |
| 0.5 MHz | 72 | 33 | 39 |
| 1.0 MHz | 62 | 29 | 33 |
| 6.2 MHz | 50 | 32 | 18 |

The data are given in units of dB microvolts, referenced to one microvolt. For example, a measured voltage of 100 microvolts corresponds to 20 LOG (100 microvolts/1 microvolt), or 40 dB. Consequently, the reductions in TABLE 2, given in dB, correspond to the fractional reductions given in TABLE 3, below.

TABLE 3

| Reduction in dB | Fractional Equivalent |
|---|---|
| 59 | 1/891 |
| 78 | 1/7942 |
| 39 | 1/89 |
| 33 | 1/45 |
| 18 | 1/8 |

Thus, for example, at 30 KHz, the reduction by 78 dB corresponds to a reduction by a factor of 7,942.

Characterization of Invention

1. It is believed that grounding of the housing H, through the braided shield BR in FIG. 4, reduces radiation of RFI by the housing.

It is believed that grounding of capacitor C2, as shown in FIG. 4, provides a shunt path to ground for RFI which would otherwise escape onto lead B+. This RFI is generated by the arcing commutator. Capacitor C2 is intended to shunt frequencies in the range of about 50 to 100 MHz, and above.

Figure 6:
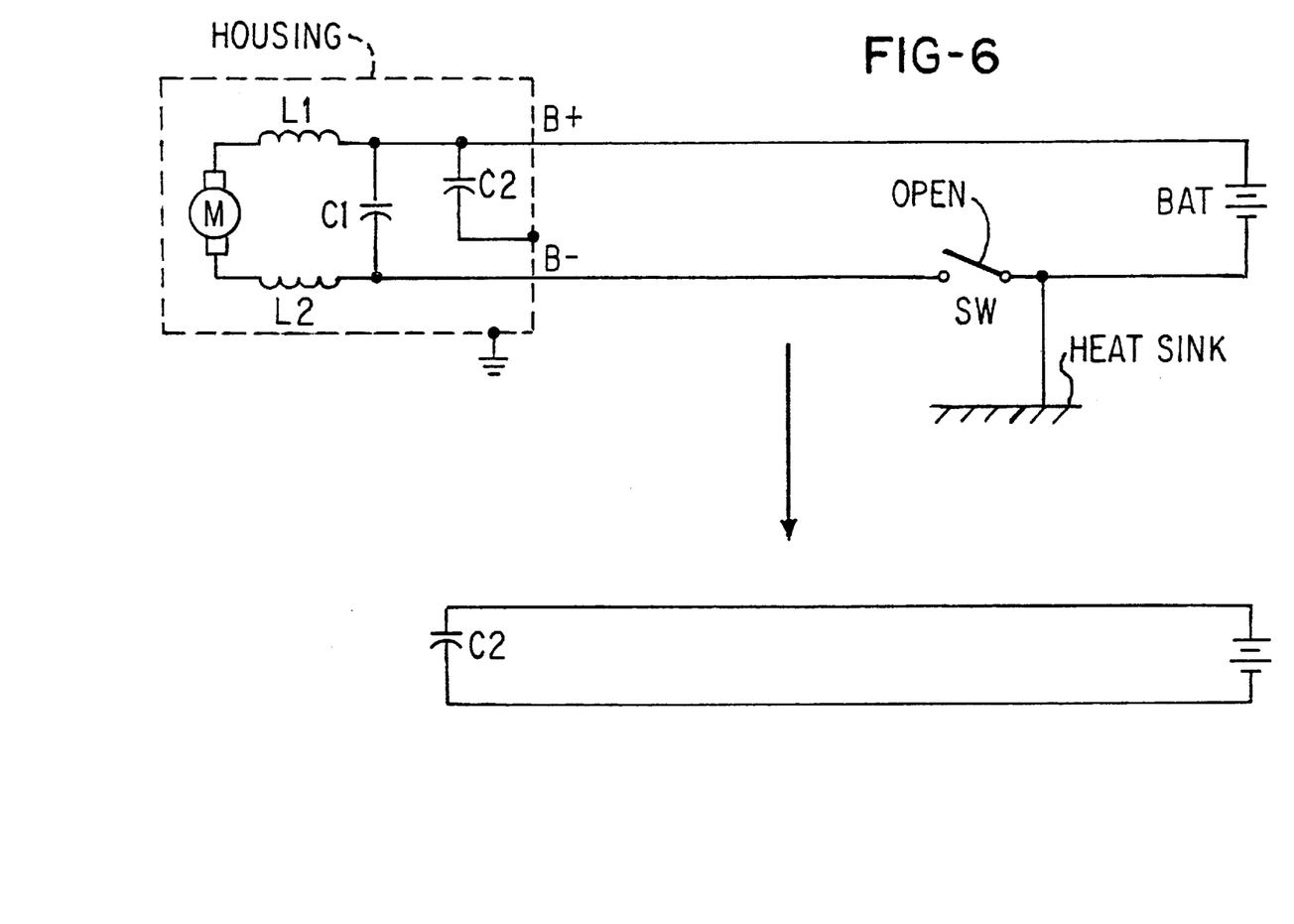
FIGS. 6 and 7 emphasize topographical aspects of FIG. 4.

2. FIG. 6 shows the apparatus of FIG. 3, when the switch SW is open. A simplification is indicated by the arrow. Capacitor C2 is in parallel with the battery.

Figure 7:
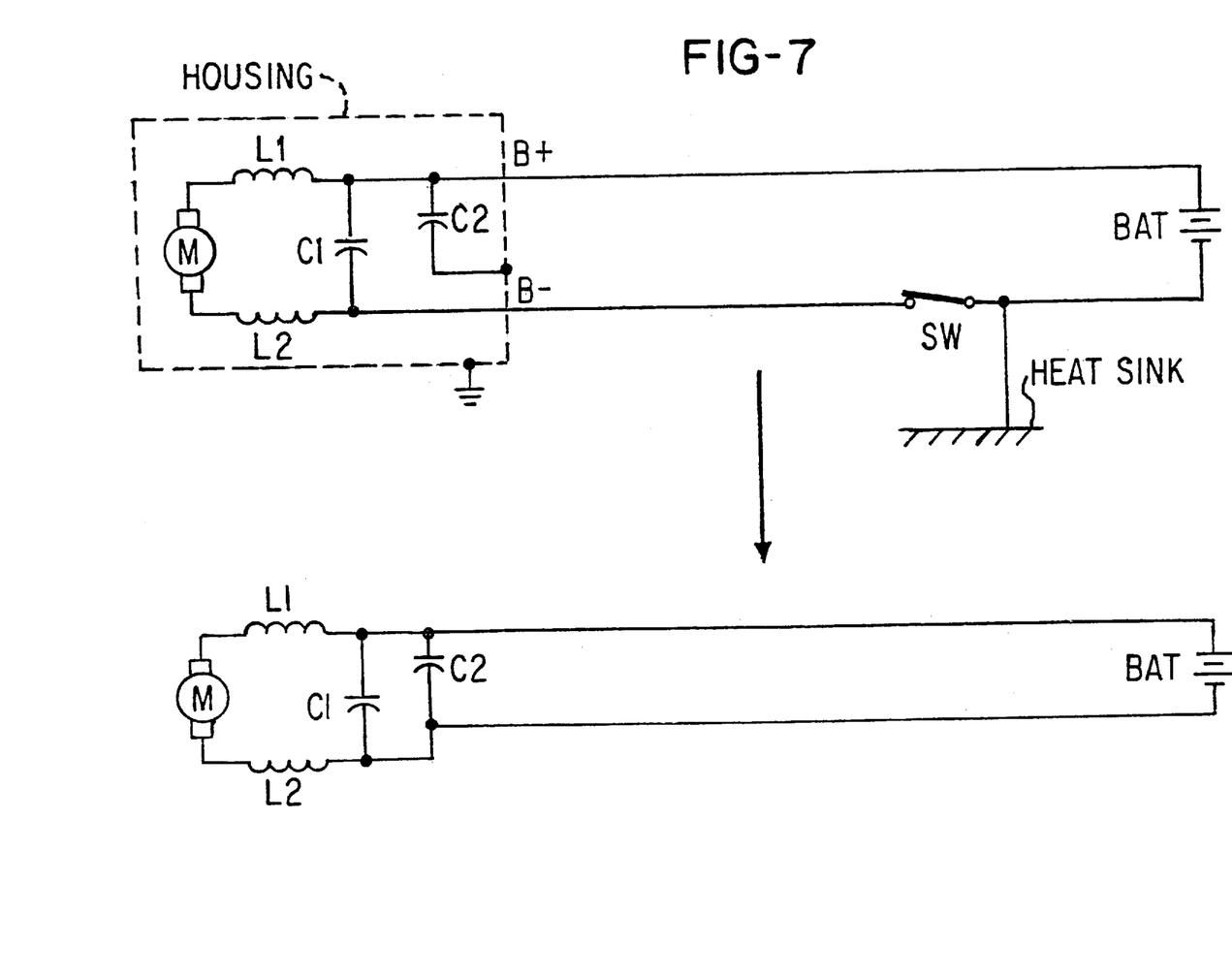

FIG. 7 shows the situation when switch SW closes. Capacitor C2 remains in parallel with the battery, but now bridges the power leads B+ and B− of the motor. The system alternates between the situations of FIGS. 6 and 7.

Significant Features

Figure 8:
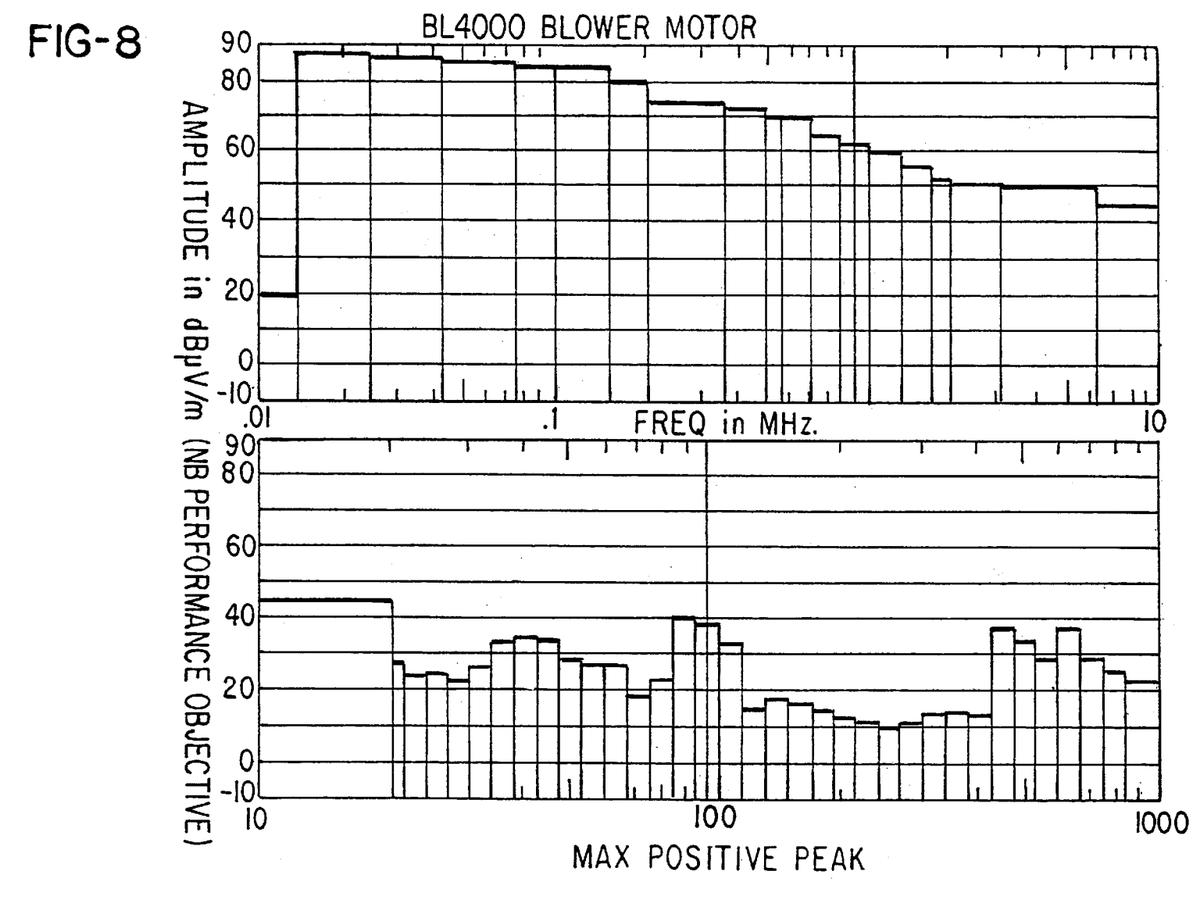
FIG. 8 is a plot showing results of the test of the apparatus of FIG. 4, but with capacitor C2 removed.

1. In addition to testing the configuration of FIG. 3, the inventors also tested the same configuration, but with capacitor C2 is absent. The test results are shown in FIG. 8.

Comparison of FIG. 8 with FIG. 5 indicates that the capacitor C2 does, in fact, reduce noise in the range below 10 MHz. This is perhaps surprising, in view of the fact that the impedance of C2 equals $1/jw(C2)$, wherein j is the imaginary operator, w is radian frequency, and C2 is the value of the capacitance. At 10 MHz, this impedance is $1/(2 \times PI \times 10 \times 10^6 \times 500 \times 10^{-12})$, which equals about 32 ohms, which is not considered a short circuit.

Further, the impedance of the capacitor increases, as frequency decreases. For example, at 1 MHz, the impedance is about 320 ohms, which is ten times the value at 10 MHz (32 ohms).

This inverse dependence of impedance on frequency seems to be inconsistent with the reduction in low-frequency noise (ie, below 10 MHz in FIG. 8) which is caused by addition of C2. This inconsistency perhaps indicates that the lumped-element model shown in FIG. 4 does not actually describe the behavior of the system, and that waveguide and transmission-line modes of operation are at work.

Figure 9:
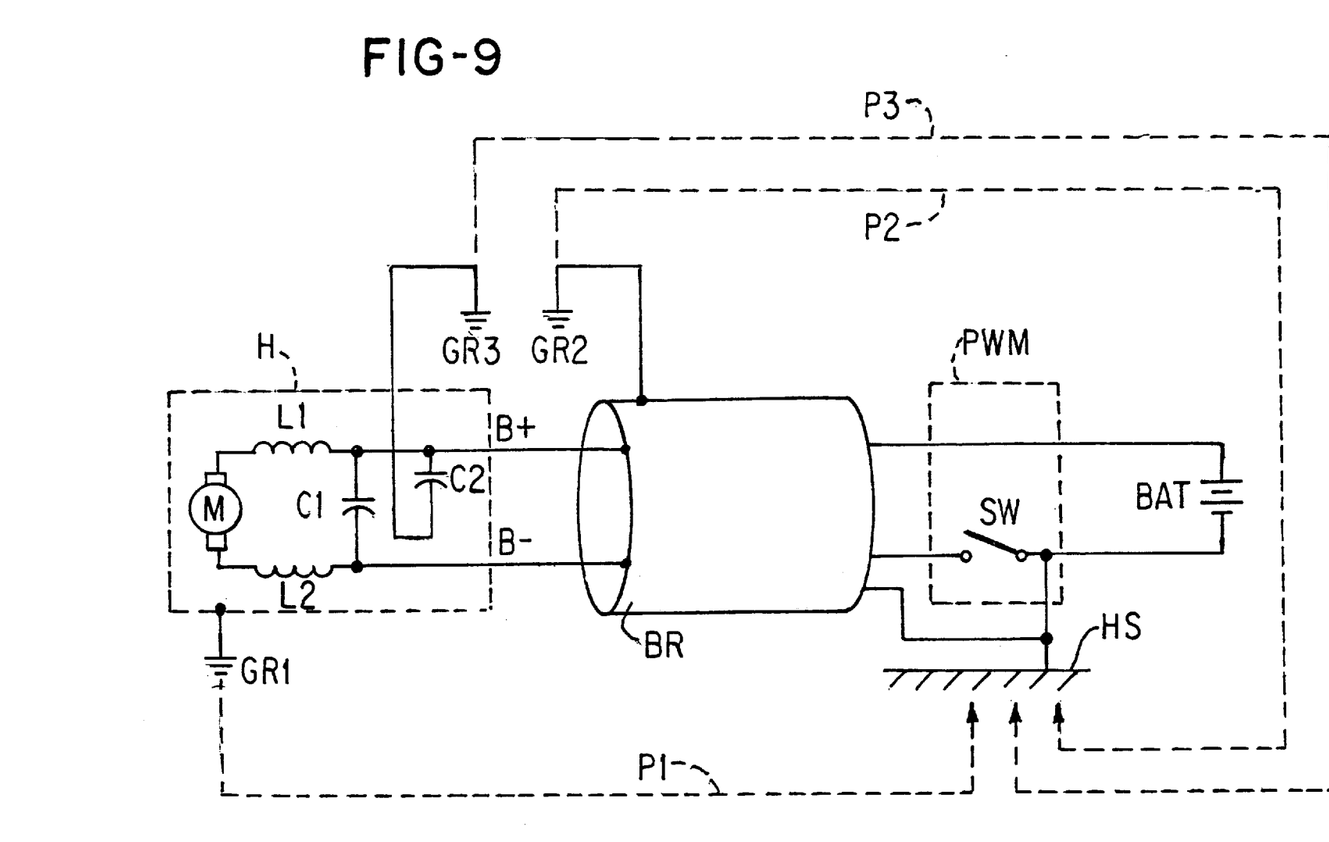
FIG. 9 illustrates three current paths taken by currents when capacitor C2, housing H, and the braided shield BR are grounded at different points.

2. The invention is expected to be used in motor vehicles. Commonly, motor vehicles are designed so that the entire metallic body and frame act as an electrical ground. Therefore, it may be thought that the configuration of FIG. 9 is feasible.

That is, it may be thought that (a) housing H, or (b) braided shield BR, or (c) capacitor C2, or any combination of these, can be grounded locally to the vehicle, at respective grounds GR1, GR2, and GR3. However, such is not the case.

One reason is that noise currents flow through the grounds. These noise currents eventually find their way to the PWM local ground, in order to complete their respective circuits. FIG. 9 illustrates three exemplary paths P1, P2, and P3 for the noise currents.

These paths act as loops, which act as antennas, which radiate noise. The radiating ability of a loop depends on its area. Thus, to keep radiation small, the loop area should be kept small. In general, grounding the three components as shown in FIG. 9 will produce relatively large loops.

In contrast, grounding as shown in FIG. 4 will produce relatively smaller loops. Therefore, it is preferable to ground in the configuration shown in FIG. 4, wherein the housing, shield, C2, and the PWM are grounded at a common point.

3. It is possible to ground the housing, capacitor C2, the braided shield, and the PWM at a point other than the PWM's local ground. Point P1 in FIG. 4 represents such a point. In this case, it is the commonality of the grounding point for four components which is significant, rather than the location of the common ground point at the PWM.

4. The housing H is not necessarily a structure which is added to a self-contained, independently operable motor, although it could be. Instead, housing H provides support for the motor, as by supporting the bearings which support the rotor, and so on.

5. The PWM frequency of 20 KHz was chosen in order to line outside the range of average human hearing The PWM controller generates a hum at the pulse frequency, which can be objectionable when the invention is used in an automobile. (A somewhat analogous hum is found in the noise produced by magnetostriction within power transformers, such as the 60 Hz buzz commonly heard in electrical equipment.) It would be preferred to run the PWM at a lower frequency, such as 10 KHz, because the solid-state electronics within the PWM are much more efficient, perhaps by as much as 40 percent, compared with 20 KHz.

6. The preferred motor draws about 25 amps, from a battery of 12 volts.

7. The invention can be used with motors which produce RFI which interferes with nearby electronic equipment. Preferred value of capacitor C2 was given above. However, C2 can range from 400–600 pico-farads.

8. Definitions. The following definitions are relevant. Other definitions for these terms can be found.

"AM frequencies" are defined as the frequency band used by AM radio, and extends from about 500 KHz to about 1600 KHz.

"FM frequencies" are defined as the frequency band used by FM radio, and extends from about 85 MHz to about 118 MHz.

"Low side chopper" is a term sometimes applied to the PWM controller shown in FIG. 2. The term is derived from the concept that the current is "chopped" to form the square wave train T, and that the chopped current is supplied to the "low side," or ground, of the motor.

Extending the terminology of the previous paragraph, the capacitor C2 extends from the "high side" to the housing, and thence to ground. Capacitor C2 can be called a "high side filter" or a "high side shunt"

Current is commonly delivered to the motor M in FIG. 2 by the leads shown. However, the current is the active agent in delivering power; the leads provide a path for the power to travel. It is the current which generates noise, and the current which travels through the braided shield BR.

The PWM controller is "remote" from the motor. The PWM controller could be contained within the same housing H as the motor, but it is not. The PWM is located such that power leads of length between 6 inches and 2 feet are required to reach the motor.

Alternate Embodiment

Figure 10:
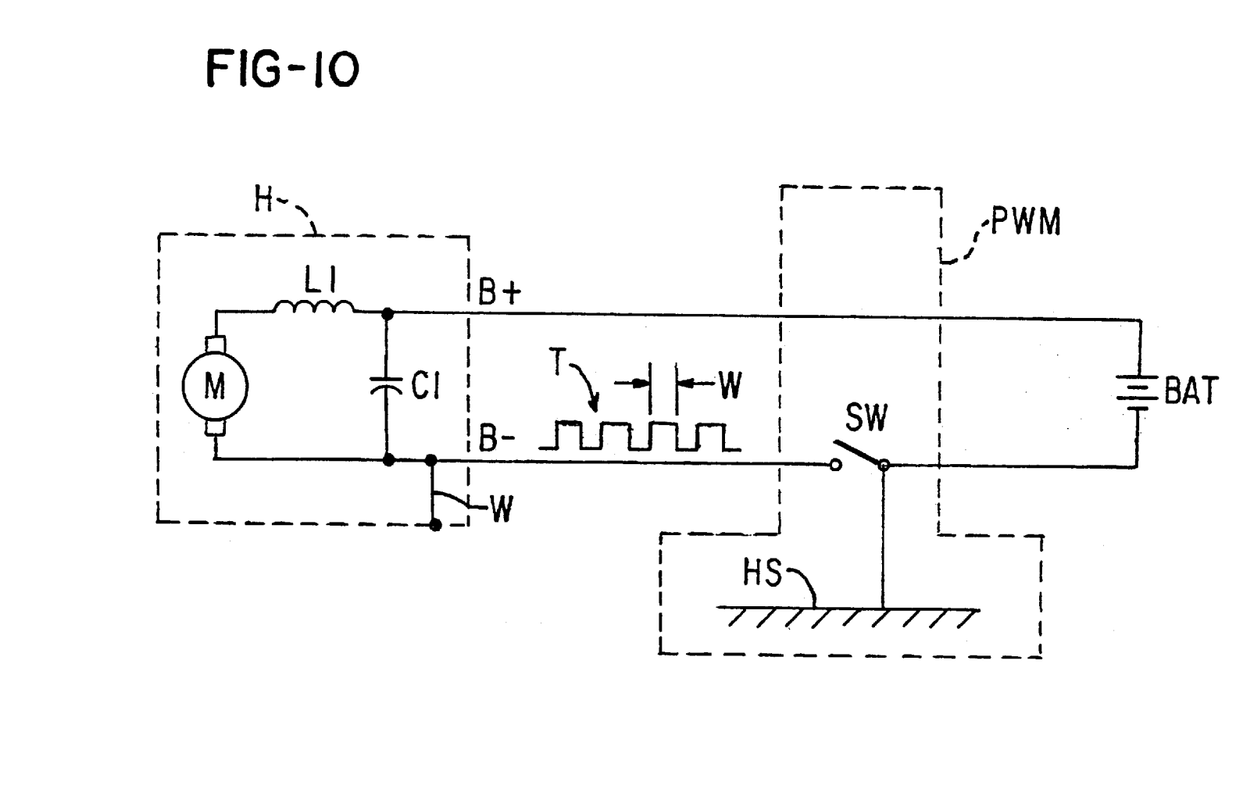
FIG. 10 illustrates an alternate embodiment of the invention.

FIG. 10 illustrates an alternate embodiment. A single inductor is used, and a ground strap GR replaces the braided shield.

Numerous substitutions and modifications can be undertaken without departing from the true spirit and scope of the invention. What is desired to be secured by Letters Patent is the invention as defined in the following claims.

We claim:

1. In a motor which is driven by current supplied on leads from a remote PWM controller, and which radiates RFI, the improvement comprising:
   a) a shield around the leads;
   b) a housing around the motor; and
   c) connections which ground the shield, the housing, and the PWM controller at a common point.

2. Improvement according to claim 1, and further comprising:
   d) a capacitor connecting between a lead and the common point.

3. Improvement according to claim 1, and further comprising:
   d) a capacitor connecting between a lead and the housing.

4. Improvement according to claim 2, in which the capacitor
   i) has a value of about 500 pico-Farads, and
   ii) reduces RFI at frequencies below 10 MHz.

5. Improvement according to claim 3, in which the capacitor
   i) has a value of about 500 pico-Farads, and
   ii) reduces RFI at frequencies below 10 MHz.

6. Improvement according to claim 1, in which the PWM produces pulses at about 20 KHz.

7. A motive power system, comprising:
   a) a power unit which generates RFI, including
      i) a motor;
      ii) a remote low-side chopper which delivers current to the motor;
   b) a conductive shield surrounding the current;
   c) a conductive housing around the motor; and
   d) connections which ground
      i) the low-side chopper,
      ii) the conductive shield, and
      iii) the conductive housing at a common point.

8. Apparatus according to claim 7, and further comprising a capacitor connecting a high voltage lead of the motor to the conductive housing.

9. Apparatus according to claim 7, in which the shield is generally tubular, and generally coaxial with the current.

10. A system, comprising:
   a) a motive power unit, including
      i) a motor;
      ii) a PWM controller, running at a base frequency which exceeds the upper limit of human hearing, for controlling speed of the motor;
      iii) components which generate RFI at the base frequency, and at harmonics of the base frequency, and which include:
         A) a housing surrounding the motor; and
         B) power leads running from the PWM controller, through the housing;
   b) noise reduction means, effective for reducing at least part of the RFI noise, by at least 20 dB.

11. A system which receives power from a battery, comprising:
   a) a motor having power leads B+ and B−, and contained within a conductive housing;
   b) a filter network interconnected within the power leads;
   c) a PWM switch for periodically dis-connecting one power lead from the battery; and
   d) a filter capacitor, in parallel with the battery, which the switch periodically bridges across B− and B+.

* * * * *